United States Patent
Nysæther

(10) Patent No.: US 7,239,153 B2
(45) Date of Patent: Jul. 3, 2007

(54) SENSOR MODULE FOR MEASURING SURFACES

(75) Inventor: Jon Nysæther, Oslo (NO)

(73) Assignee: Idex ASA, Fornebu (NO)

( * ) Notice: Subject to any disclaimer, the term of this patent is extended or adjusted under 35 U.S.C. 154(b) by 0 days.

(21) Appl. No.: 10/506,197

(22) PCT Filed: Feb. 28, 2003

(86) PCT No.: PCT/NO03/00071

§ 371 (c)(1),
(2), (4) Date: Dec. 14, 2004

(87) PCT Pub. No.: WO03/075210

PCT Pub. Date: Sep. 12, 2003

(65) Prior Publication Data

US 2005/0089200 A1    Apr. 28, 2005

(30) Foreign Application Priority Data

Mar. 1, 2002 (NO) .................................. 20021031

(51) Int. Cl.
G01R 27/26 (2006.01)
G01R 27/08 (2006.01)
G06K 9/00 (2006.01)
G09G 5/00 (2006.01)

(52) U.S. Cl. ..................... 324/661; 382/124; 345/173; 324/691

(58) Field of Classification Search ................ 382/124; 324/662

See application file for complete search history.

(56) References Cited

U.S. PATENT DOCUMENTS

| | | | | | |
|---|---|---|---|---|---|
| 5,325,442 | A | * | 6/1994 | Knapp ......................... | 382/124 |
| 5,748,005 | A | * | 5/1998 | McCormick et al. ........ | 324/662 |
| 5,767,686 | A | * | 6/1998 | Kespohl ...................... | 324/662 |
| 6,525,547 | B2 | * | 2/2003 | Hayes .......................... | 324/662 |
| 6,538,456 | B1 | * | 3/2003 | Dickinson et al. .......... | 324/658 |
| 6,882,164 | B2 | * | 4/2005 | Yano et al. .................. | 324/663 |
| 2003/0161512 | A1 | * | 8/2003 | Mathiassen et al. ........ | 382/124 |

FOREIGN PATENT DOCUMENTS

| WO | WO 99/43258 A1 | 9/1999 |
|---|---|---|
| WO | WO 01/94902 A2 | 12/2001 |
| WO | WO 01/94902 A3 | 12/2001 |
| WO | WO 01/99036 A2 | 12/2001 |
| WO | WO 01/99036 A3 | 12/2001 |

* cited by examiner

Primary Examiner—Andrew H. Hirshfeld
Assistant Examiner—Jeff Natalini
(74) Attorney, Agent, or Firm—Rothwell, Figg, Ernst & Manbeck

(57) ABSTRACT

This invention relates to a sensor module for measuring structures in a surface, especially in a finger surface being moved over the sensor module, that includes a number of sensor elements, and an outer electrode located aside the sensor elements, the sensor elements being coupled to at least one AC drive circuit providing a varying current or voltage, thus coupling a signal through the sensor elements to the outer electrode.

The sensor elements are also coupled to an electronic circuit positioned on a substrate, the substrate includes conductor leads coupling the sensor elements to the electronic circuit, and the electronic circuit being adapted to measure the magnitude of the capacitance or AC impedance.

8 Claims, 3 Drawing Sheets

SENSOR MODULE FOR MEASURING SURFACES

CROSS REFERENCE TO RELATED APPLICATIONS

This application is a 371 of PCT International Application PCT/NO03/00071 filed on Feb. 28, 2003.

This invention relates to a sensor module being capable of sensing the topological pattern of a surface in direct contact with it, e.g a fingerprint.

The market of biometrics is evolving rapidly. However, for biometrics to penetrate the consumer market, there are strict requirements with respect to e.g. sensor price, compactness, fingerprint image quality and power consumption.

AC capacitive fingerprint sensors are one of the most promising technologies for realizing compact and low cost fingerprint sensors for the consumer markets, and several concepts have been proposed over the past few years. The sensor concepts roughly divide into two categories: matrix sensors, where the fingerprint is placed onto a two-dimensional sensor surface, and scanners or sweep sensors, where the user is required to pull his or her finger across the sensor to capture an image.

U.S. Pat. No. 6,069,970 describes a typical matrix type, AC capacitive fingerprint sensor. The sensor is basically a silicon chip (IC) which is furnished with a 2-D matrix of sensor elements ("pixels") as well as amplifiers and other circuitry. A drive electrode located on the sensor package, outside the active sensing surface, is used to couple an AC voltage into the finger. The AC signal then penetrates the finger and couples through a dielectric layer to sensor elements (pads) on the surface of the sensor. The sensor pads are coupled to amplifying circuitry in the silicon chip.

This sensor configuration however has several disadvantages: For obvious reasons, the active surface of a matrix sensor needs to be as large as the portion of the finger that shall be imaged, in other words in the order of 100 $mm^2$. Because the price of silicon ICs increases proportionally with the chip area, such a large chip may be forbiddingly expensive for many consumer applications.

In addition, the fact that the finger is in direct contact with the surface of an active silicon IC puts a heavy demand on the materials used to protect the IC against wear, mechanical impacts, humidity, chemical compounds and electrostatic discharges (ESD). This may make it necessary with unstandard and expensive protective materials, or may lead to reduced reliability and lifetime of the sensors.

Fingerprint scanners, where the user is required to pull his or her finger across the sensor, do not have to have the same length as the fingerprint, and may therefore be smaller and more cost-effective. Because of their reduced size and lower price, scanning sensors may be a better choice for typical mass consumer applications. Scanners require only a very limited number of sensor lines, and while the width of the sensor still has to match the width of the fingerprint, the sensor length may be as low as a few mm or even less. The "linear" arrangement of sensor elements also gives more flexibility in designing the interface between the sensor and the finger—it does not necessarily have to be a flat surface like matrix sensors often are.

Patent application WO 97/58342 shows an example of a scanning sensor where the amplifying silicon IC is placed on a orinted circuit board and where the board edge constitutes the interface between sensor and finger. In this sensor, each sensor element is a fine-line trace on the board running perpendicular to the finger surface. The outer ends of the traces are covered with a dielectric layer to assure a pure capacitive coupling to the finger surface. To be able to determine the speed of the finger, two lines of sensor elements are used, one on each side of the board. The speed measurement is needed for building up a 2-D image based on the readings from the sensor. Examples of other scanning sensors are given in U.S. Pat. No. 6,289,114, WO01/99036 and EP 0 735 502 A2.

In the sensor configuration described in WO 97/58342, the size of the amplifying and signal conditioning IC is linked neither to the width or length of the portion of the fingerprint to be captured. This makes it possible to design a much smaller IC chip and thus to save cost.

The described sensor however has the disadvantage that it is quite large and bulky, and that the circuit board which extends in a direction perpendicularly to the finger surface gives the sensor a very high profile. For many applications, e.g mobile phones, a sensor profile of less than a few millimeters will be desired to have room for the sensor in the phone.

This problem is solved in the sensor described in patent application WO01/99035. This patent application describes a fingerprint scanner where the integrated circuit with amplifiers etc (ASIC) is mounted on the back side of a substrate. The substrate is for instance silicon, ceramics or glass. The top side of the substrate is equipped with a number of conductive pads for sensing the capacitance, and conductive vias are made through the substrate to connect each sensor pad or element with a corresponding input pad on the ASIC. The sensor pads are covered with a dielectric material.

This substrate based sensor has several advantages: First of all, it maintains all the advantages of the scanner, where the size of the costly ASIC is "decoupled" from the size of the finger. In addition, the substrate, which is far less expensive to make per area, serves as a mechanical and environmental protection for the vulnerable ASIC on its back side. The sensor has a very low profile, and if supplied with e.g. BGA balls it does not have to be further packaged before mounting it onto a motherboard, e.g in a phone.

The sensor also has the advantage that drive electrodes for stimulating the finger with an AC signal can be integrated directly on the surface of the substrate. These drive electrodes may be coupled to ground through an ESD protecting semiconductor device, so that any ESD discharge from the finger will go to the electrode rather than to the sensor pads. Unlike a matrix sensor, the opening in the drive electrode around the pads can be very small, minimizing the risk of ESD induced damage even for very "localized" electric discharges.

All the three above described principles however require that the finger is stimulated directly with an AC voltage. This may not always be an advantage. For instance, the signal from the unshielded drive electrode may in some cases create electrical interference with other electronic equipment.

For the substrate based sensor described in patent application WO01/99035 there is yet another disadvantage: For shielding purposes it will often be necessary to place a grounded layer (or a layer at any other fixed potential) between the drive electrode and the underlying circuitry. This however means that the AC signal from the drive electrode will couple capacitively to this grounded layer and thereby increase the current consumption of the sensor. This may be a disadvantage especially for hand-held equipment such as mobile telephones where battery lifetime is of great importance. The consumed current may be particularly large for large drive electrodes, this dielectrics and high drive voltages. Similar disadvantages are related to the similar solutions described in WO01/99036 and WO01/94902.

Three possible solutions to this problem is to decrease the drive voltage, to decrease the size of the drive electrode or to increase the thickness of the dielectric between the two metal planes. All these approaches however have their drawbacks: A lower drive voltage will decrease the signal to noise ratio and limit the system's ability to resolve certain types of fingerprints, e.g from very dry fingers. If the drive electrode is too small the signal level may also be reduced because the contact area for coupling the AC voltage into the finger is insufficient. In addition, when a finger is present the AC signal will couple from the finger to the underlying ground anyhow, regardless of the presence of the drive electrode. So the effect with respect to current consumption is questionable. To use a thicker dielectric may be impractical from a process point of view. Hard, durable dielectric materials compatible with e.g silicon substrate technology, such as SiO2 or SiN, are seldom more than a couple of microns thick. Polymeric materials such as polyimide may be thicker but are not as reliable with respect to wear.

It is therefore an object of this invention to provide a sensor module in which the external electrode in direct contact with the finger could be grounded or coupled to another fixed potential instead of carrying an AC voltage. This would also have an advantage with respect to ESD as the discharges would go directly to ground without the need for any extra protecting device, or without any risk that the driver circuit will be damaged by such discharges.

One sensor principle where the electrode in contact with the finger is grounded is described in U.S. Pat. No. 5,862,248. This sensor is however not a scanner and therefore suffers from the general drawbacks of matrix sensors described above.

The present invention aims at a scanning sensor principle which features low cost, low current consumption, high reliability against environmental and mechanical impacts, ease of packaging and mounting, low electromagnetic radiation to the surroundings and high tolerability to ESD. The invention is characterized as described in the independent claim.

According to a preferred embodiment of this invention the substrate of the sensor module is provided with a number of openings through which openings electrical contacts being coupled to the sensor elements are lead, and that the electronic circuit is positioned on the opposite side of the substrate relative to the sensor elements.

According to an alternative embodiment the module comprises at least one AC drive electrode and an array of capacitances, resistances or other impedance networks for coupling the signal on said drive electrodes to said sensor elements. The substrate is fabricated from silicon, glass, ceramics or a polymeric material.

According to a preferred embodiment the module comprises one or more electrodes being capable of exiting each sensor element, so that the response from each sensor element may be calibrated.

The invention is described below with reference to the accompanying drawings, illustrating the invention by way of examples.

Figure 2:
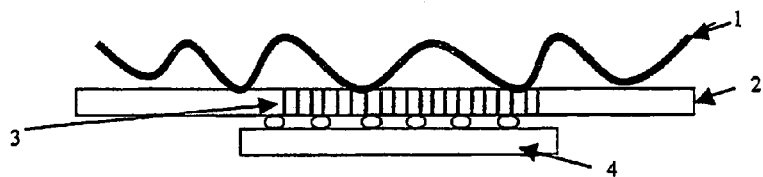
FIG. 2 illustrates a longitudinal section of the sensor.
Figure 3:
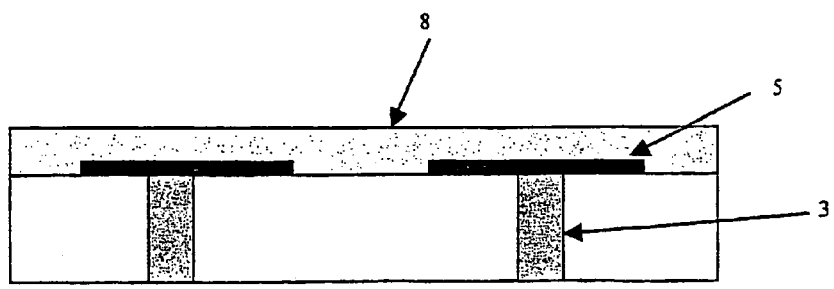
FIG. 3 illustrates a cross section of the invention.
Figure 4:
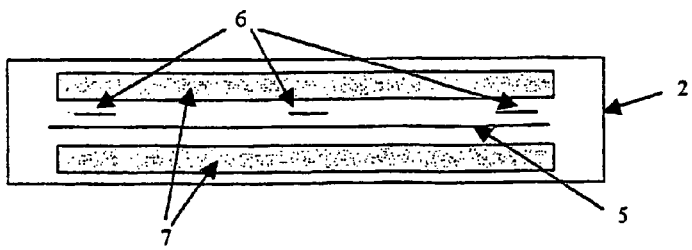
FIG. 4 illustrates a sensor according to the invention as seen from above.

In one preferred embodiment, detailed in FIGS. 2, 3 and 4, the invention consists of a substrate 2 which may be fabricated from e.g silicon, glass, ceramics, flexprints or a laminate board. On the top side of the substrate, where the finger to be imaged 1 shall be pulled across, a number of sensor elements 5 are defined, e.g as conductive pads made in a planar process. The sensor elements may either be covered with a dielectric such as SiO2 or SiN or be in galvanic contact with the finger. The sensor elements are preferably arranged in a single line with additional sensor elements 6 for detecting the speed and/or the direction of movement, including rotation, of the finger across the sensor. These movement measurements may either be used for correcting the image with respect to variances in finger speed, pull direction or rotation, or e.g to move a cursor across a screen ("mouse").

The top surface of the sensor preferably contains a grounded electrode 7, preferably in direct contact with the surroundings, which covers an at least significant part of the substrate surface. Alternatively the electrode may be covered with a dielectric material 8.

The substrate further contains a number of via holes 3 through which connections from the sensor pads 5 are taken through the substrate 2 to the back side. The via holes 3 are generated by laser or mechanical drilling or an etching process and must subsequently be electrically isolated from the substrate, if the latter is conductive. This may be done by e.g oxidation or deposistion techniques. If necessary, additional routing is included between the bottom end of the via holes and the substrate bonding pads of an ASIC 4 which is mounted on the back side of the substrate (e.g flip-chip or wire bonded). Alternatively, there may be routing on top of the substrate as well, preferably in an additional layer below the grounded electrode 7. In case of silicon or any other conducting or semiconducting substrate type, the substrate 2 is at a fixed potential.

The ASIC contains a number of amplifiers 16 to amplify the signal associated with each imaging channel (sensor element), as well as other signal conditioning circuitry.

Figure 1:
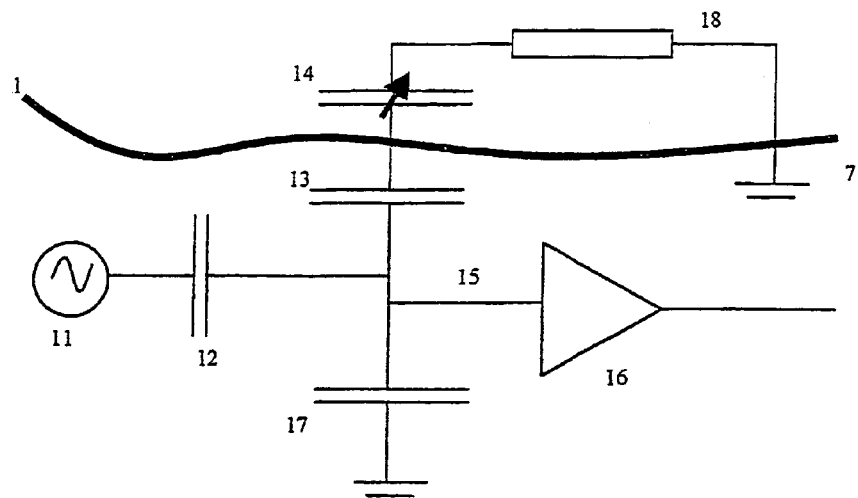
FIG. 1 illustrates a schematic circuit according to the invention.

Finally, the sensor contains one or several drive circuits 11 that may be used to couple an AC signal (current or voltage) to each sensor pad node 15. From each node, this signal will couple through the sensor dielectric (if any), through the finger and to the grounded electrode 7 on the sensor surface. These drive circuits may for instance be realized e.g as constant amplitude AC current sources. The current sources may be coupled to the sensor pad nodes 15 either directly or through an impedance network. Alternatively the drive circuits may be realized as AC voltage electrodes coupled to the individual channels (sensor pads) through capacitances or other impedance networks. The drive circuits may either be located in the circuitry on the ASIC or on any side of the substrate. AC voltage electrodes with a pure capacitive coupling, as shown in FIG. 1, may for instance be obtained by fabricating plate capacitors in a two-layer metallization process. To minimize current consumption it is however important that the parasitic coupling from these drive electrodes to ground is as small as possible. Alternatively, a resistive coupling or more complicated impedance networks may be used.

A schematic version of a preferred measuring principle is shown in FIG. 1. An AC voltage signal 11 from the drive electrode couples to the sensor pad/amplifier input node 15. In an alternative embodiment the combination of 11 and 12 may be replaced by for instance a constant amplitude AC current source. In the case shown in FIG. 1, the input signal voltage to the ASIC amplifier 16 is given by the voltage division between the capacitor 12 and the combined capacitance of the capacitor to ground 17 in parallel with the series capacitance of 13 (through the sensor dielectric 8), and 14 (through the finger ridge or through an air gap in a valley). The additional series impedance 18 through the finger is for this discussion assumed to be negligible. Because all other elements are fixed, the magnitude of the input signal will change dependent on the magnitude of the capacitance 14, which varies depending on whether there is a finger ridge or valley present. The voltage input signal at 15 may be amplified e.g by a non-inverting voltage amplifying circuit.

To maximize sensitivity, the magnitude of the capacitor 12 should be comparable to capacitor 17. In some cases capacitor 17 is dominated by the input capacitance of the ASIC amplifier, and may therefore be of a certain minimum size (for instance a few pF) for practical reasons. In this case the capacitor 12 will also have to be comparably large. In the general case 17 does not have to be a capacitor, but can be any kind of impedance network or other circuitry with a controlled relationship between current and voltage.

The invention is however not limited to the coupling described in FIG. 1, and other schematics, including current sensing techniques may be used to measure the magnitude of the variable capacitor 14, which is the main measurand.

Figure 5:
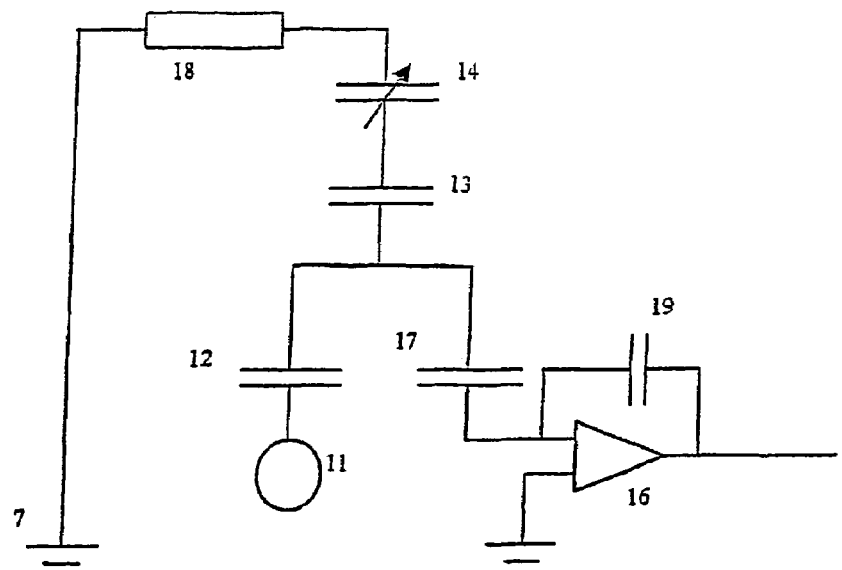
FIG. 5 illustrates an alternative measuring circuit with inverting amplifier

An alternative measuring principle is shown in FIG. 5. Here an inverting amplifier is employed to measure the current flowing from the drive electrode to the virtual ground terminal of the amplifier 16 through the capacitances 12 and 17. The output voltage from the amplifier is given by the voltage drop of said current across the feedback capacitor 19.

The advantage with this principle is that the input capacitance of the ASIC does not impact on the measurements. This means that the capacitance 12 does not have to be comparable to the ASIC input capacitance, but only to the capacitance 17 which can be made arbitrarily small.

Figure 7:
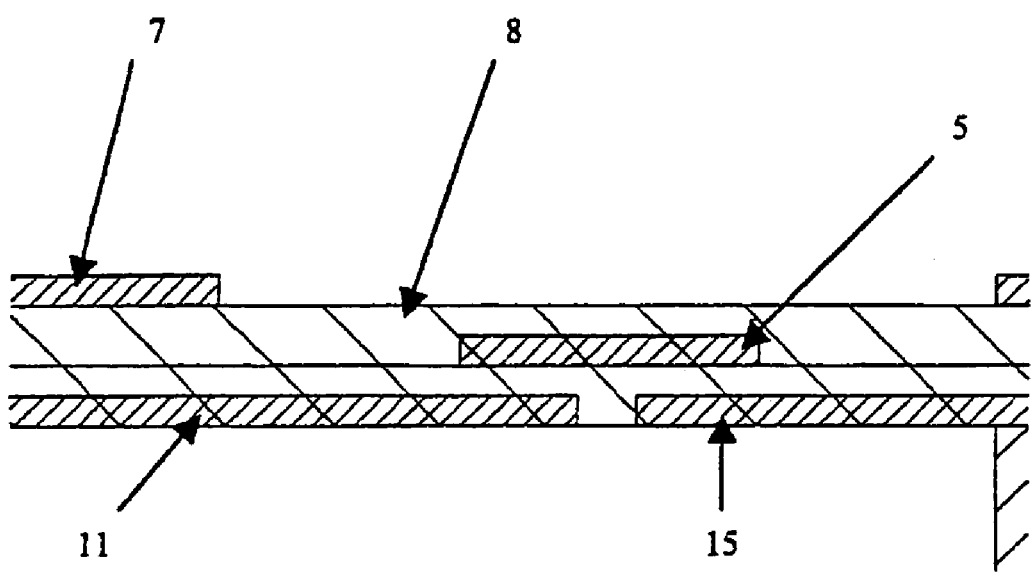
FIG. 7 illustrates the cross section of a detail of area around sensor element in a sensor module according to the invention.

FIG. 7 shows an example of how the principle of FIG. 5 can be implemented in a three layer metallization process on the sensor surface. Here the drive electrode and signal track to the ASIC are fabricated in a metal layer directly below the sensor elements, and separated from the latter by a dielectric material to achieve a capacitive coupling between the sensor elements and said electrodes and tracks.

Figure 6:
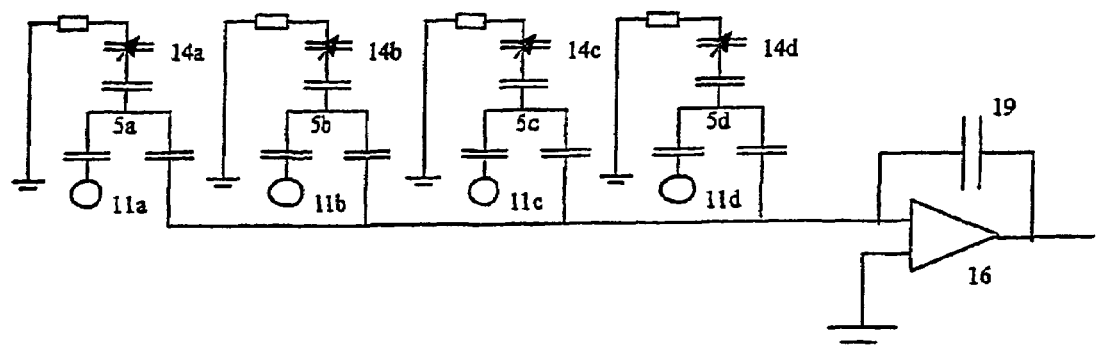
FIG. 6 illustrates schematically a measuring system based on the circuit in FIG. 5 with several sensor elements.

FIG. 6 shows a situation where several sensor elements 5a-5d are coupled to the same sensor input channel. The channels have separate drive electrodes 11a-11d that can be operated independently. It can be seen from FIG. 7 that only those sensor elements with an "active" drive electrode (i.e a drive electrode with an AC voltage) will contribute to the signal current. This arrangement thus makes it possible to "multiplex" the signal from the various sensor elements on the substrate using the signal on the drive electrodes as "control signal". This may be an advantage as it allows to switch between several sensor elements using the same ASIC input channels, so that the number of channels can be reduced.

As is evident from the drawings the sensor module according to the invention may include electronic circuitry comprising input means including at least two amplifier circuits 16, each amplifier circuit being coupled to a sensor element set 5a-5d including at least two sensor elements for amplifying the signals therefrom. Each sensor element 5a-5d in each set being coupled to a different drive unit 11a-11d for exciting each sensor element according to a predetermined sequence. The amplifier circuit thus receiving a signal from only one sensor element in said set at the time, which thus provides a multiplexed signal being transmitted to the electronic circuitry.

The abovementioned WO01/99035, which describes the preferred method for producing the sensor module according to the invention requires that a large number of routing tracks from the sensor elements are taken through the substrate and connected to the ASIC. Several problems are related to this solution: First of all, the employed substrate technology must allow for a large number of through-going conductive vias within a relatively small area. This excludes the use of a number of different low-cost substrate processes. As an example, present day technology for both ceramic, glass and laminate substrates may have problems with the requirement for via density.

The large number of connections also in practice excludes the possibility of taking the connections out on the side of the sensor using wire bonds.

In addition, there needs to be one ASIC input channel, and possibly even one preamplifier, for each sensor pad on the top surface. As both the i/o pad, amplifier and related ESD protection circuitry consumes space on the ASIC, it will be difficult to reduce the size of the chip below a certain limit. This may make it difficult to reach the extremely low production costs needed for a mass produced sensor.

The embodiment of the invention referred to in FIG. 6 provides a sensor module in which the number of needed connections between the sensing surface and the ASIC, and the number of input channels on the ASIC, is significantly reduced. This will lead to a simpler substrate and reduce the size of the ASIC, thus reducing the production cost of the sensor. Moreover, the number of channels are reduced by providing a form of sensor element "multiplexing" which is carried out on the substrate, and which preferably does not employ active switches or other semiconductor based components.

To calibrate the response from the sensor, a calibrating capacitor can be coupled between 15 and another AC electrode that can be turned on and off. When the electrode is turned on, the change in input signal level at the input 15 will represent the overall variations in the magnitude of 12, 17 and 13, as well as the gain of the amplifier. This reading can therefore be used to normalize the output from each channel. For the calibration to be less sensitive to the presence of a finger pattern during calibration, 17 should preferably be large compared to 13. Alternatively an AC current source may be used for calibration.

The present invention combines many of the advantages of the sensor technologies described in WO01/99035, U.S. Pat. No. 5,862,248 and WO 97/58342, while reducing or eliminating some of the drawbacks. As an example, the proposed sensor can be an essentially linear scanning sensor with a small size and low cost, unlike the sensor proposed in U.S. Pat. No. 6,069,070 or U.S. Pat. No. 5,862,248. Unlike the sensor in WO 97/58342 it has a very low profile, and unlike the sensor in WO01/99035 there is no extra current consumption linked with driving an external drive electrode or a finger in close contact with a grounded layer. It also eliminates the need for an active drive electrode in direct contact with the finger as proposed in both WO01/99035, U.S. Pat. No. 6,069,070 and WO 97/58342. If the external electrode is grounded, this will make use of additional ESD protection circuitry less necessary as discharges from the finger will go directly to ground. The use of a grounded top layer may also be an advantage with respect to electromagnetic radiation to the surroundings.

The advantages of the current invention over the other principles discussed is however not limited to situations where it is desirable to have a a grounded layer in contact with the finger. By powering the outer electrode 7 with an AC signal which is inverted with respect to the signal 11, a larger current will flow out to 7 through the finger, and this will result in a signal increase at the amplifier input. If the magnitudes of 12 and 17 are comparable, it will be possible to increase the signal strength by a factor of around 3 relative to the situation where 7 is at a fixed potential. In a practical device, this may for instance be an option that can be "turned on" if the sensor detects that the signal level is below a critical value.

In other embodiments the contact between the finger and the sensor pad may also be galvanic, and a shunting capacitance or impedance (equivalent to 13) added between the pad and the input terminal of the amplifier. Also the dielectric layer 8 may be provided with upper conductors moulded in an insulating material such as plastic, for direct contact with the finger surface, e.g for shaping the upper surface of the sensor in order to improve the contact with the finger or to provide a sensor element structure being different from the structure being provided by the locations of the sensors 5. This provides a sensor surface which keeps its electrical characteristics even if the surface is worn down.

Although WO01/99035 is discussed here the alternative embodiment described in WO01/99036 may also be employed according to this invention. In this embodiment the substrate is a semiconductor and the electronic circuits are positioned into or on the same side of the substrate as the sensor elements, being provided with layers of electrically conductive and insulating materials for positioning the electrodes and the shielding the system.

The invention claimed is:

1. Sensor module for measuring structures in a surface, especially in a finger surface being moved over the sensor module,
   comprising a number of sensor elements and an outer electrode located aside the sensor elements, said sensor elements constituting an essentially linear array, and said outer electrode having larger dimensions than each of said sensor elements and extending along a substantial part of said array of sensor elements,
   the sensor elements also being coupled to an electronic circuit positioned on a substrate, said substrate comprising conductor leads coupling the sensor elements to the electronic circuit, and said electronic circuit being adapted to measure a magnitude of a capacitance or AC impedance between each of said number of sensor elements and the outer electrode,
   and that said array of sensor elements is adapted to measure a movement between the sensor and the surface, the electronic circuit being adapted to measure the magnitude of the capacitance or impedance between each sensor element and the outer electrode at chosen points of time, and to combine the measured values to generate a representation of a surface pattern,
   wherein the sensor elements are coupled to at least one drive circuit providing a varying current or voltage, thus coupling a signal through the sensor elements to the outer electrode, said outer electrode being powered by an AC signal being inverted with respect to the signal coupled to the sensor, so that said electronic circuit measures the magnitude of the capacitance or AC impedance between each of said number of sensor elements being provided with said signal and said outer electrode being provided with the inverted AC signal,
   wherein the magnitude of the capacitance or AC impedance between each of said number of sensor elements and the outer electrode is measured through a single signal path.

2. Sensor module according to claim 1, wherein the substrate is provided with a number of openings through which openings electrical contacts being coupled to the sensor elements are lead, and that the electronic circuit is positioned on the opposite side of the substrate relative to the sensor elements.

3. Sensor module according to claim 1, wherein the module comprises at least one AC drive electrode and an array of capacitances, resistances or other impedance networks for coupling the signal on said drive electrodes to said sensor elements.

4. Sensor module according to claim 1, where the substrate is fabricated from silicon, glass, ceramics or a polymeric material.

5. Sensor module according to claim 1, in which the module comprises one or more electrodes being capable of exiting each sensor element, so that a response from each sensor element may be calibrated.

6. Sensor module according to claim 1, wherein the substrate is a semiconductor, and where electronic circuits are defined in the top surface of the substrate.

7. Sensor module according to claim 1, wherein the at least one drive circuits are AC current sources.

8. Sensor module according to claim 1, wherein said electronic circuitry comprises input means including at least two amplifier circuits, each amplifier circuit being coupled to a sensor element set including at least two sensor elements for amplifying signals therefrom and transmitting the signals to said electronic circuitry, each sensor element in each set being coupled to a different drive unit for exciting each sensor element according to a predetermined sequence, the amplifier circuit thus receiving a signal from only one sensor element in said set at a time.

* * * * *